United States Patent [19]

Rubin et al.

[11] 4,320,352
[45] Mar. 16, 1982

[54] INPUT OPTIMIZED FET BIAS CIRCUIT

[75] Inventors: Michael D. Rubin, Saratoga; Pang T. Ho, Mountain View, both of Calif.

[73] Assignee: Ford Aerospace & Communications Corp., Detroit, Mich.

[21] Appl. No.: 116,527

[22] Filed: Jan. 29, 1980

[51] Int. Cl.³ .............................................. H03F 3/16
[52] U.S. Cl. .................................... 330/277; 330/289; 330/296
[58] Field of Search ............... 330/277, 286, 289, 296, 330/300

[56] References Cited

U.S. PATENT DOCUMENTS

| | | | |
|---|---|---|---|
| 4,011,518 | 3/1977 | Irvine et al. | 330/277 X |
| 4,077,013 | 2/1978 | Morez et al. | 330/267 |
| 4,123,722 | 10/1978 | Cubbison, Jr. | 330/85 |
| 4,152,666 | 5/1979 | Kajikawa et al. | 330/277 |

FOREIGN PATENT DOCUMENTS

| | | | |
|---|---|---|---|
| 52-37751 | 3/1977 | Japan | 330/296 |
| 52-56844 | 5/1977 | Japan | 320/277 |

*Primary Examiner*—James B. Mullins
*Attorney, Agent, or Firm*—Alan Huang; Edward J. Radlo; Robert D. Sanborn

[57] ABSTRACT

A field effect transistor bias circuit is presented which exhibits a low impedance for small signals and a high impedance for large signals. This circuit uses an operational amplifier to provide a temperature compensated low impedance voltage source for the gate bias which is optimal for small signal operation. In the presence of a large signal, the gate begins to draw current. This causes the operational amplifier to saturate and transforms the bias circuit into a high impedance source, which is optimal for large signal operation.

14 Claims, 5 Drawing Figures

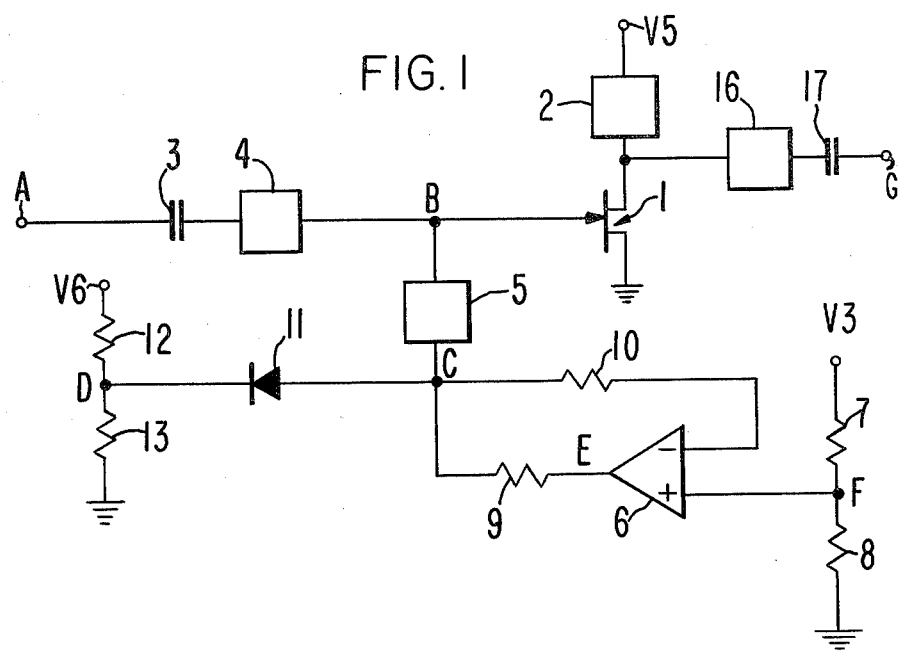
FIG. 1
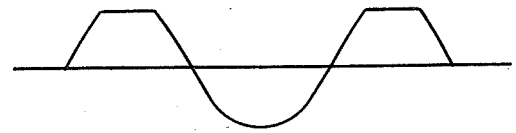
CLIPPING DUE TO FORWARD CONDUCTION
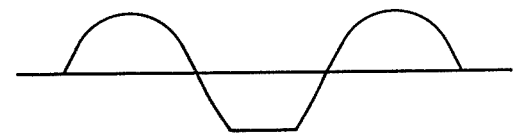
CLIPPING DUE TO REVERSE BREAKDOWN
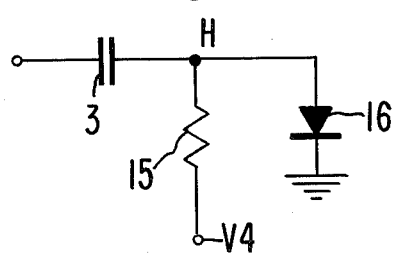
FIG. 3
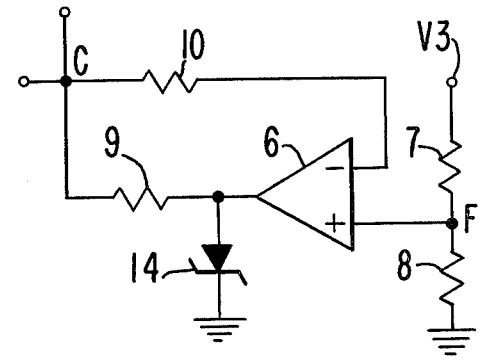
FIG. 4

INPUT OPTIMIZED FET BIAS CIRCUIT

BACKGROUND OF THE INVENTION

1. Field of the Invention

This invention is a device for biasing a field effect transistor in an optimal manner for both small and large signal operation. While this circuit can be used for any FET, it is especially attractive for GaAs FET's used as microwave power amplifiers.

2. Description of the Prior Art

A prior art search has uncovered the following references:

U.S. Pat. No. 4,011,518 is a microwave GaAs FET amplifier with a temperature compensating bias to minimize intermodulation distortion. The bias varies only with temperature. No provision is made to compensate for variations in the input signal strength as in the present invention.

U.S. Pat. No. 4,077,013 is an audio power amplifier with a switched bias supply to minimize power consumption. This invention activates the bias current of a Darlington pair in the presence of an input signal. Neither the bias nor the impedance of the network is altered to accommodate for small and large signal operation as in the present invention.

U.S. Pat. No. 4,123,722 is an operational amplifier decoupling circuit which uses a matched amplifier to compensate for voltage offsets and leakage currents of the amplifier. It is not intended as a bias source nor does it in any way adapt for small and large signal operation as does the present invention.

U.S. Pat. No. 4,152,666 is a FET amplifier which uses a circulator to isolate the input signal and supply a fixed bias to the gate. The bias is not active nor does it adjust in any way for large and small signal operation as does the present invention.

The prior art search also uncovered the following secondary references:

U.S. Pat. Nos. 4,105,944, 3,501,710, 4,042,886, 3,906,386, and 3,747,005.

SUMMARY OF THE INVENTION

The optimal bias of an FET is quite different for small and large signal operation. For small signals it is desirable to have a bias supply which is stable, temperature compensated, and of low impedance. The stability and temperature compensation is needed to insure constant gain. The low impedance is desirable to minimize the effect of any leakage current of the FET on the bias voltage.

For large signal operation it is desirable to have a high impedance bias network. This high impedance limits the gate current and provides a bias which self centers the input signal. It is desirable to limit the gate current since electromigration of metals used for the gate of an FET is an important failure mechanism of GaAs FET's. This migration is proportional to gate current.

Present approaches to biasing either compromise performance, or else restrict the use of the amplifier to either large or small signal operation.

An operational amplifier is used as a voltage follower to apply a bias voltage to the gate of a field effect transistor. This provides a stable low impedance bias which is optimal for small signal operation. When the input signals are increased to the point of input rectification, gate current will begin to flow. The operational amplifier will compensate and prevent these currents from affecting the bias until it saturates. Upon saturation of the amplifier, the bias network will appear as a fixed high impedance source, which is optimal for large signal operation.

BRIEF DESCRIPTION OF THE DRAWINGS

These and other more detailed and specific objects and features of the present invention are more fully disclosed in the following specification, reference being had to the accompanying drawings, in which;

FIG. 1 is a schematic diagram of the preferred embodiment of the present invention;

FIGS. 2A and 2B show the clipping of large signals due to forward conduction (FIG. 2A) and reverse breakdown (FIG. 2B) of a field effect transistor;

FIG. 3 is a schematic diagram showing a large signal electrical equivalent of a FET gate and bias network; and FIG. 4 shows a circuit using Zener breakdown rather than amplifier saturation to invoke high impedance bias operation.

DESCRIPTION OF THE PREFERRED EMBODIMENT

FIG. 1 is a schematic diagram of a FET amplifier and its biasing circuit. A N-channel depletion mode microwave FET is used for discussion; however, the invention can be adapted for use with other types of FET's. The basic amplifier consists of N-channel depletion mode microwave power GaAs FET 1. A voltage supply V5 is connected to an output biasing network 2 which is in turn connected to the drain of the FET. The output matching circuit 16, connected between the drain and one end of output coupling capacitor 17, provides impedance matching between the drain of the FET and the load. The other end of capacitor 17 is connected to output terminal G. The source of the FET is connected to ground. The input signal applied at point A passes through blocking capacitor 3 and input impedance matching network 4 to point B, connected to the gate of the FET. A gate bias decoupling network 5, which passes D.C. but blocks R.F., is connected from B to an adaptive biasing circuit at point C.

The adaptive biasing circuit consists of an operational amplifier 6 and resistors 7, 8, 9, and 10. Resistor 7 is connected between a voltage supply V3 and point F. Resistor 8 is connected between ground and point F. Resistors 7 and 8 divide voltage V3 to produce a gate bias reference voltage at point F, which is connected to the positive input of amplifier 6. The output of amplifier 6, point E, is connected through resistor 9 to point C. Resistor 9 limits the current between the gate and the operational amplifier. The resistance value of 9 is chosen to limit the gate current at the desired value. Resistor 10 is a feedback resistor connected between C and the negative input of amplifier 6. Operational amplifier 6 follows the voltage at F and provides a low impedance duplicate of it to point C.

Diode 11 and resistors 12 and 13 form a fail safe gate bias voltage limiter. Resistor 12 is connected between a voltage supply V6 and point D. Resistor 13 is connected between ground and point D. Resistors 12 and 13 are small enough in resistance to sink the current of op amp 6. They divide voltage V6 to produce a fail safe bias reference voltage at point D. If the voltage at point C becomes more positive than that a point D, diode 11 will be forward biased and conduct. This limits the voltage at point C to the sum of the voltage at point D plus the voltage drop across the diode. This protects the FET by limiting the gate bias voltage and thus also limiting the drain current.

An optimal bias circuit for small signal operation will minimize the effects of temperature and leakage current on the gain. By properly temperature compensating the reference bias voltage at F, the gate bias at B will also be temperature compensated. The generation of a temperature compensating reference voltage is well known. One approach involves using a temperature sensitive resistive element for either of resistors 7 and 8 or both.

Another requirement of a bias for small signal operation is to minimize the effect of the leakage current from the source through the gate. This current in conjunction with the impedance of the bias network will upset the bias voltage and modify the gain of the FET. In this circuit, the leakage current passes through resistor 9, since diode 11 is back biased and feedback resistor 10 is connected to a high impedance input of the operational amplifier. This current through resistor 9 will cause the voltage at C to become more positive. This voltage is fed back to the operational amplifier via resistor 10. The unbalance at the inputs of amplifier 6 causes the voltage at E to become more negative and compensate for the leakage current-induced voltage offset. The result is that the voltage at C will become the same as that at F. This bias voltage will be maintained independent of the leakage current. The bias circuit will thus appear to be a very low impedance voltage source.

An optimal bias circuit for large signal operation should limit the gate current and have a large impedance to enable the signal to self center. As the drive signal level is increased, a point will be reached at which input signal rectification will occur and gate current will flow. If the signal is too positive, forward conduction will occur and allow current to pass through the gate. This will result in the clipping of the positive peaks of a biased sinusoidal input signal, as shown in FIG. 2A. If the signal is too negative, reverse breakdown will occur and allow current to emerge from the gate. This will result in the clipping of the negative peaks of a biased sinusoidal input signal, as shown in FIG. 2B.

The desirability of a high impedance bias for large signal operation can be seen in FIG. 3. This Figure is a simple model of the gate circuit of the FET. Capacitor 3 is the input capacitor, resistor 15 represents the impedance of the bias circuit, V4 is the bias voltage, and diode 16 represents the gate of FET 1.

If the signal is too positive, the gate will forward conduct and current will flow from V4 through gate 16 via impedance 15. This current through impedance 15 will make the voltage at point H more negative, thus lowering the bias level of the input signal and reducing the positive clipping.

If the signal is too negative, the gate will undergo reverse breakdown and current will flow from the gate through impedance 15 to V4. This current through impedance 15 will make the voltage at point H more positive, thus raising the bias level of the input signal, and reducing the negative clipping.

Whether the signal is too positive or too negative, gate current will flow through impedance 15 and produce an offset voltage to reduce the clipping. The larger the impedance, the larger the offset voltage will be. It is thus desirable in large signal operation to have a bias circuit with a high impedance since it provides this self centering current limited bias level. This high impedance contrasts with the low impedance necessary for small signal operation.

A large impedance 15 is also desirable to minimize the gate current. This is particularly important with power FET's since gate current causes gate metallization to migrate. This reduces the life and effectiveness of the device.

If a large RF signal causes FET 1 to enter either forward conduction or reverse breakdown, gate current will flow. The output voltage of the operational amplifier 6 will change to keep the gate voltage constant. At some point when sufficient gate current flows amplifier 6 will saturate and make the bias circuit appear like a fixed high impedance source as modeled in FIG. 3. This will result in a self centering bias level for the input signal.

If a large positive signal pushes FET 1 into forward conduction, the current passing into the gate through resistor 9 makes the gate bias voltage at C more negative. This voltage is fed back to the input of amplifier 6 via resistor 10. The imbalance at the inputs of amplifier 6 will make the amplifier output at E more positive and compensate for the voltage offset caused by the forward conduction current. This will keep the gate at the same voltage as F. If the input signal continues to increase, the forward conduction current will eventually cause amplifier 6 to saturate. The bias circuit will then appear as resistor 9 connected to a fixed voltage which is equal to the positive saturation voltage of amplifier 6. The circuit then behaves like the model shown in FIG. 3 and provides a self centering bias level to reduce the positive clipping.

If a large negative signal puts FET 1 into reverse breakdown, current from the gate will flow through resistor 9 making the gate bias voltage at C more positive. This voltage is fed back to the input of amplifier 6 via resistor 10. The imbalance at the inputs of amplifier 6 will make the amplifier output at E more negative and compensate for the voltage offset caused by the reverse breakdown current. This will keep the gate at the same voltage as F. If the input signal continues to increase, the breakdown current will eventually cause amplifier 6 to saturate. The bias circuit will then appear as resistor 9 connected to a fixed voltage which is equal to the negative saturation voltage of amplifier 6. The circuit then behaves like the model shown in FIG. 3 and provides a self centering bias level to reduce the negative clipping.

In the case of both forward conduction and reverse breakdown, the gate current is limited by resistor 9. During clipped large signal operation, the average current is $||VMAX| - |(VFC+VRB)/2||/R$ where VMAX is the saturation voltage of amplifier 6, VFC is the forward conduction voltage of FET 1, VRB is the reverse breakdown voltage of FET 1, and R is the resistance of resistor 9. To minimize the gate current, R should be as large as possible. However, R should not be so large such that $(ILEAK) \times (R)$ approaches $||VMAX| - |VBIAS||$ where ILEAK is the maximum leakage current of the FET and VBIAS is the bias voltage at F. If R is this large, the operational amplifier 6 will not be able to compensate for the leakage current during small signal operation.

In some situations, it is not desirable to wait for amplifier 6 to saturate before the high impedance bias mode is invoked. FIG. 4 shows how a Zener diode can be added between the output of amplifier 6 and ground to accomplish this. Zener diode 14 limits how negative the output voltage of amplifier 6 can be. The fail safe circuit (diode 11 and resistors 12 and 13) limits how positive point C can be. This brackets the range of gate currents which can be compensated for. When amplifier 6 reaches the limit imposed by diode 14, the bias circuit behaves like a fixed high impedance voltage source.

In a typical circuit FET 1 is or is similar to a FUJITSU power FET type FLC-30. The power supplies V5 and V3 are typically 9 and −7 volts d.c., respectively. Voltage source V6 is usually the same voltage at V3. The blocking capacitors 3 and 17 are typically about 100 pf. For microwave applications, the impedance matching networks 4 and 16 are typically microstrip matching circuits. Decoupling network 5 is typically an L type filter consisting of a 250 nanohenry inductor connected between B and C with a 1500 pf capacitor connected from C to ground. Decoupling (output biasing) network 2 blocks r.f. energy while minimizing the amount of d.c. loss. Network 2 typically comprises an L type filter consisting of a 250 nanohenry inductor connected between the drain of FET 1 and V5, and a 1500 pf capacitor connected between V5 and ground. Amplifier 6 is or is similar to a National Semiconductor LM108. If resistors 7 and 8 are their typical values of 1.85K and 2.0 Kohms, respectively the gate bias reference voltage will be −3.64 volts. If resistors 12 and 13 are their typical values of 2000 and 1000 ohms, respectively, a fail safe bias of −1.6 volts will be provided. In this particular case, resistors 9 and 10 can be 390 and 18 Kohms, respectively.

It should be noted that the fail safe circuit composed of items 11, 12 and 13 is not necessary to the operation of the circuit but merely protects the FET. If a suitably rugged FET is used then these items may be omitted. The maximum positive voltage would then be determined by the saturation of the operational amplifier 6.

This discussion was directed to N-channel depletion mode FET's. This novel input optimized bias circuit can also be used with N-channel enhancement mode, P-channel depletion mode, and P-channel enhancement mode field effect transistors. The modifications necessary would be apparent to a person skilled in the art.

The above description is included to illustrate the operation of the preferred embodiments and does not limit the scope of the invention. The scope of the invention is to be limited only by the following claims. From the above discussion many variations will be apparent to one skilled in the art that would yet be encompassed by the spirit and scope of the invention.

What is claimed is:

1. An adaptive gate bias circuit for a field effect transistor having a gate, a drain, and a source, comprising:
 a bias reference voltage;
 an operational amplifier having a first input connected to the bias reference voltage; and
 a first resistance connected between the output of the amplifier and the gate of the FET;
 wherein said operational amplifier is not connected to said drain and is not connected to said source;
 wherein said circuit changes the bias voltage on the gate as a function of the amplitude of an input signal coupled to the gate.

2. The circuit of claim 1 further comprising a second resistance connected between a second input of the amplifier and the gate of the FET.

3. The circuit of claim 1 wherein the amplifier compensates for voltage disparity between the signal applied at the gate and the reference voltage.

4. The circuit of claim 1 wherein the amplifier saturates due to the presence of a large input signal applied to the gate, causing the bias circuit to behave as a fixed voltage in series with the first resistance.

5. The circuit of claim 1 wherein said first resistance is connected to said gate via a decoupling network; and said source is grounded.

6. A circuit as recited in claim 1 further comprising voltage limiting means connected to said gate to limit the voltage thereon.

7. A circuit as recited in claim 6 wherein said voltage limiting means comprises:
 a fail safe reference voltage; and
 a diode connected between the fail safe reference voltage and said gate.

8. A circuit as recited in claim 1 wherein the bias reference voltage is temperature compensated;
 wherein said signal is an alternating current signal.

9. A circuit as recited in claim 1 further comprising a Zener diode, connected between the output of the operational amplifier and ground, for limiting the output voltage of the amplifier.

10. A circuit as recited in claim 1 wherein the field effect transistor is a N-channel depletion mode FET and the bias reference voltage is negative;
 wherein said operational amplifier has a positive and a negative input and the first input of the operational amplifier is the positive input.

11. A circuit as recited in claim 1 wherein the bias reference voltage compensates for temperature sensitive characteristics of the FET;
 wherein said signal does not pass through said adaptive gate bias circuit.

12. A circuit for adaptively biasing a field effect transistor having a gate, a drain, and a source, comprising:
 reference bias voltage means; and
 a voltage follower having an input connected to the reference bias voltage means and an output connected via a bias decoupling network to the gate of the FET;
 wherein the voltage follower provides a low impedance voltage source when it is not in saturation, and provides a high impedance voltage source when it is in saturation.

13. A bias circuit for a field effect transistor having a gate, a drain, and a source, comprising:
 a bias reference voltage;
 an operational amplifier having a first input connected to the bias reference voltage; and
 a first resistance connected between the output of the amplifier and the gate of the field effect transistor;
 wherein the value of said first resistance is sufficient to limit the gate current of the transistor and yet is not so large as to compromise the ability of the amplifier to compensate for the effect of any transistor leakage current;
 wherein said amplifier is not connected to said source and is not connected to said drain.

14. The circuit of claim 13 further comprising:
 a feedback resistance having a value much larger than that of the first resistance;
 wherein said feedback resistance is connected between the gate and a second input of the amplifier.

* * * * *